United States Patent
Hellweg et al.

(10) Patent No.: US 10,775,691 B2
(45) Date of Patent: Sep. 15, 2020

(54) METHOD FOR EXAMINING PHOTOLITHOGRAPHIC MASKS AND MASK METROLOGY APPARATUS FOR PERFORMING THE METHOD

(71) Applicant: Carl Zeiss SMT GmbH, Oberkochen (DE)

(72) Inventors: Dirk Hellweg, Langenau (DE); Markus Koch, Neu-Ulm (DE); Renzo Capelli, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 95 days.

(21) Appl. No.: 16/126,402

(22) Filed: Sep. 10, 2018

(65) Prior Publication Data

US 2019/0079381 A1    Mar. 14, 2019

(30) Foreign Application Priority Data

Sep. 11, 2017   (DE) ....................... 10 2017 215 995

(51) Int. Cl.
| | |
|---|---|
| *G03F 1/22* | (2012.01) |
| *G03F 1/84* | (2012.01) |
| *G03F 1/72* | (2012.01) |
| *G03F 7/20* | (2006.01) |

(52) U.S. Cl.
CPC .................. *G03F 1/22* (2013.01); *G03F 1/72* (2013.01); *G03F 1/84* (2013.01); *G03F 7/70666* (2013.01)

(58) Field of Classification Search
CPC ..... G03F 1/22; G03F 1/72; G03F 1/84; G03F 7/70666
See application file for complete search history.

(56) References Cited

U.S. PATENT DOCUMENTS

| | | | |
|---|---|---|---|
| 2008/0128643 A1 | 6/2008 | Mueller et al. | |
| 2017/0010540 A1* | 1/2017 | Dmitriev | ................. H01L 22/20 |
| 2017/0228477 A1 | 8/2017 | Solowan | |

FOREIGN PATENT DOCUMENTS

| | | | |
|---|---|---|---|
| DE | 102007043635 | 3/2008 | ............... G03F 7/20 |
| DE | 102017101340 | 8/2017 | ............... G03F 1/84 |

OTHER PUBLICATIONS

German Examination Report for German Application No. 10 2017 215 995.2 dated Apr. 23, 2018.

(Continued)

*Primary Examiner* — Diane D Mizrahi
(74) *Attorney, Agent, or Firm* — Fish & Richardson P.C.

(57) ABSTRACT

The invention relates to a method for examining a photolithographic mask for the extreme ultraviolet (EUV) wavelength range in a mask metrology apparatus. In this method, at least one structured region of the mask is selected, a scanner photon number in the extreme ultraviolet (EUV) wavelength range for which the mask in the lithographic production run is provided and a metrology photon number in the extreme ultraviolet (EUV) wavelength range with which the measurement is performed are determined. Next, a photon statistics examination mode is established on the basis of the scanner photon number and the metrology photon number and at least one aerial image of the at least one structured region is produced with the mask metrology apparatus.

20 Claims, 3 Drawing Sheets

(56) References Cited

OTHER PUBLICATIONS

De Bisschop, et al., "Impact of Stochastic effects on EUV printability limits", *Proc. of SPIE*, vol. 9048, pp. 904809-1-904809-15 (Apr. 17, 2014).
Qi, et al., "Contribution of EUV mask CD variability on LCDU", *Proc. of SPIE*, vol. 10143, pp. 10143Y-1-10143Y-9 (Mar. 2017).

\* cited by examiner

METHOD FOR EXAMINING PHOTOLITHOGRAPHIC MASKS AND MASK METROLOGY APPARATUS FOR PERFORMING THE METHOD

CROSS REFERENCE TO RELATED APPLICATIONS

This application claims priority under 35 U.S.C. § 119 to German Application DE 10 2017 215 995.2, filed on Sep. 11, 2017, the entire content of which is incorporated herein by reference.

TECHNICAL FIELD

The invention relates to a method for examining masks as they are used in the microlithographic manufacture of semiconductor components. The invention furthermore relates to an apparatus that is designed for performing said method.

BACKGROUND

Photolithographic masks—frequently also referred to in general as photomasks, masks or reticles—are projection templates, the most important application of which is photolithography for producing semiconductor components, in particular integrated circuits. As a result of the continuously growing integration density in the semiconductor industry, photolithographic masks must image ever smaller structures onto a light-sensitive layer, i.e. onto a photoresist on wafers. To meet this requirement, the exposure wavelength of photolithographic masks has been shifted from the near ultraviolet via the mid-ultraviolet into the far ultraviolet range of the electromagnetic spectrum. Currently, use is normally made of a wavelength of 193 nm for exposing the photoresist on wafers. Future lithography systems will probably operate with wavelengths in the extreme ultraviolet (EUV) range (preferably but not necessarily in the range of 6 nm to 15 nm). The currently particularly preferred wavelength is 13.5 nm.

The EUV wavelength range places huge demands on the precision of optical elements in the beam path of future lithography systems. In all probability, the optical elements, and hence also the photolithographic masks, will be reflective optical elements. Said masks have a multilayer structure, e.g. of a periodic sequence of molybdenum and silicon. Additionally, an absorber structure of absorbing pattern elements is applied to the multilayer structure. In the regions of the EUV mask covered by pattern elements of the absorber structure, incident EUV photons are absorbed or at least not reflected like in other regions. As a consequence, the production of photolithographic masks with increasing resolution becomes ever more complex and therefore also ever more expensive.

Photolithographic masks must be largely error-free, since an error of the mask would reproduce on each wafer during each exposure. In the case of a photolithographic mask, it is important that the pattern elements of the absorber structure on the photolithographic mask exactly image the structure elements predetermined by the design of the semiconductor element into the photoresist on the wafer. The intended dimension of the structure elements produced in the photoresist by the absorber pattern is referred to as the critical dimension (CD). This dimension and the variation thereof (CDU, critical dimension uniformity) are central characteristic variables for the quality of a photolithographic mask. Freedom of errors for photolithographic masks in this context means that the mask upon exposure with the actinic wavelength images an intended dimension within a predetermined error interval onto a wafer, i.e. the CD may only vary within the predetermined error interval. If this condition is satisfied, the photolithographic mask has no visible defects or printable defects on a wafer. Since not every defect is a printable effect, masks are examined using mask metrology apparatuses. By way of example, AIMS and the series WLCD by Carl Zeiss SMT GmbH are mentioned.

It is known that in the transition from UV wavelengths, such as e.g. 193 nm, to EUV wavelengths, statistical effects of photons play a role. The wavelength reduction from 193 nm to 13.5 nm in lithography apparatuses results in a photon energy which is approximately 14 times higher. The reduction in size of the lithographically defined structures furthermore results in a surface density of the structures which is approximately 5 to 10 times higher. As a consequence, approximately two orders of magnitude fewer photons per structure element are used in EUV lithography, with the result that the statistical effects increase considerably. These effects are described for example in "Impact of Stochastic effects on EUV printability limits," P. De Bisschopa et al., 2014, Proc. of SPIE Vol 9048 and "Contribution of EUV mask CD variability on LCDU," Zhengqing John Qi et al., 2017, Proc. of SPIE 10243.

The statistical effects are caused firstly in the aerial image due to interaction of the photons with the photomask, and in addition, statistical effects likewise occur during the exposure in the photoresist. Typical characteristic variables on the exposed wafer are, e.g. the line edge roughness (LER), line width roughness (LWR) and the local variation in the wafer-side critical dimension (LCDU, local critical dimension uniformity). In particular for the masks and the process control and for the development of the qualification of lithographic processes and photoresists, a separation of the contributions by aerial image and photoresist with respect to the statistical processes is advantageous.

SUMMARY

In a general aspect, the present invention permits examination and qualification of photolithographic masks under conditions that are as close as possible to the later use in lithography apparatuses with respect to statistical contributions caused by the interactions of the photons with the mask.

In accordance with a first aspect of the invention, a method for examining a photolithographic mask for the extreme ultraviolet (EUV) wavelength range in a mask metrology apparatus is therefore specified, wherein the method includes the following steps:

a. selecting at least one structured region of the mask, b. determining a scanner photon number in the extreme ultraviolet (EUV) wavelength range for which the mask is provided in the lithographic production run, c. determining the metrology photon number in the extreme ultraviolet (EUV) wavelength range with which a measurement is performed, d. establishing a photon statistics examination mode on the basis of the scanner photon number from step b) and the metrology photon number from step c), e. producing at least one aerial image of the at least one structured region with the mask metrology apparatus.

In mask metrology apparatuses, aerial images of the mask are recorded to ascertain whether the image of a selected region of the mask has the desired quality. If a possible defect has been identified in a region, it is possible on the basis of said aerial image to ascertain whether such a defect also has an influence on the exposed wafer. In other words, it is determined whether the defect is printed or not. If the defect has no influence on the imaged structure in the wafer, the mask can be continued to be used. If on the other hand the effect also results in a defect in the imaged structure in the wafer, measures must be taken. It is possible to not use the defective mask. Since the costs of masks in the EUV range are very high, this leads to high economic losses. An alternative measure is to correct the defect. If such a correction is performed, the success of the correction must be checked in a later step. In such a verification step, the corrected mask is measured once again in the mask metrology apparatus. To perform the measurement, first a region of the mask that is to be measured must therefore be selected. Since the intention is to ascertain how the structures are imaged in the wafer, the region must be taken at least in part from the structured region.

Typically an attempt is made in mask metrology apparatuses to keep the influence of the mask metrology apparatus itself on the measurement as small as possible. Aerial images or aerial image series of masks are recorded in the mask metrology apparatus. The mask metrology apparatus frequently comprises a light source and a recording device, such as, e.g. a camera having a charge coupled device (CCD) for recording the aerial image. The light sources that are used in the mask metrology apparatus can differ from those used in the lithography apparatus—also known as scanners because lithography apparatuses nowadays operate on the step-and-scan principle. To ensure that the special properties of the metrology light source influence the aerial images of the region of the photolithographic mask as little as possible, the measurement duration is typically selected to be so long that statistically varying properties of the metrology light source on account of averaging make only a minor contribution to the aerial image of the mask. This metrology photon number $N_{Metro}$ is therefore dependent on the wavelength, the output of the metrology light source and the measurement duration, that is to say what is known as the integration time during the recording of the aerial image or the aerial image series. The term "dose" (used in particular in English-speaking areas) here refers to an energy quantity, e.g. as "dose to clear" the quantity of energy that is required to expose the photoresist. The quantity of energy E is here related to the photon number N by the known equation $E=N*h*c/\lambda$. In this case, $\lambda$ represents the wavelength, c represents the speed of light in a vacuum and h represents Planck's constant.

The photon number $N_{Scanner}$, which is used in the lithography apparatus to expose the photoresist, is established by the resist properties. Since a quick cycle time in the manufacture of semiconductor elements is vital, the photoresist should be exposed at low energy quantities. Since the photon number at EUV light $N_{EUV}$ is obtained by that at deep ultraviolet (DUV) light $N_{DUV}$ from the abovementioned equation, fewer EUV photons are required at the same amount of energy.

$$N_{EUV} = N_{DUV} \frac{\lambda_{EUV}}{\lambda_{DUV}}$$

For example, if the selection for $\lambda_{EUV}$=13.5 nm and $\lambda_{DUV}$=193 nm, the result for the EUV photon number $N_{EUV}$=0.07 $N_{DUV}$, that is to say a photon number which is 14 times lower. This results in effects in the photoresist that depend on the different number of photons that are incident at a given site of the imaged structure. For example, with identical settings of the operating parameters of the lithography apparatus, the critical dimension (CD), the line edge roughness (LER), the line width roughness (LWR) and other parameters can fluctuate more statistically at different locations of the wafer. One obvious possibility for lowering the influence of the statistical fluctuations would be to increase the photon number of the scanner $N_{Scanner}$. However this would lower the productivity by the same factor, that is to say, e.g. to 7% of the previous productivity. For this reason, this solution is not advantageous. The effects caused by the photon statistics obviously also occur at higher wavelengths such as 193 nm. However, in this region the effects are currently completely negligible. Yet if the accuracy requirements should increase even in this wavelength region, the methods explained in this application are in principle applicable to any wavelength range.

Mask metrology apparatuses do not have to meet the same productivity requirements as lithography apparatuses. A stable and reproducible measurement result is paramount. For this reason, a longer measurement time with a correspondingly higher photon number $N_{Metro}$ is generally selected. This results in the effects of the photon statistics in the measurement having a negligible influence on the measurement result. If the defects on the mask are of interest, this mode is also advantageous. It has now been found that, in addition to the defects that arise during the writing of the mask, the photon statistics effect on the finished wafer must also be taken into account in the mask metrology apparatus. To this end, the scanner photon number $N_{Scanner}$ in the extreme ultraviolet (EUV) wavelength range for which the mask is provided in the lithographic production run must be determined.

In order to be able to correctly take into account the photon statistics during the measurement of the photolithographic mask in the mask metrology apparatus, first the metrology photon number $N_{Metro}$, with which a measurement is performed, must be known. To this end it is necessary for an energy calibration of the recording apparatus with which aerial images are recorded in the mask metrology apparatus to be available. That is to say, the relationship between the metrology photon number and the measurement signal of the recording apparatus must be known. If the recording apparatus is, for example, a CCD camera, the relationship between the metrology photon number and the count rate of the CCD camera must be calibrated absolutely.

Depending on the scanner photon number and the metrology photon number in the respective measurement mode of the mask metrology apparatus, a photon statistics examination mode is now established and at least one aerial image of the at least one structured region is produced. The photon statistics examination mode can in this case be a direct recording of the at least one aerial image, in which the metrology photon number and scanner photon number are substantially identical, furthermore a recording of a support aerial image having a metrology photon number which is so high that photon statistics effects are negligible, and subsequent modification of the aerial image with a photon statistics model or a recording of a plurality of support aerial images and subsequent interpolation or extrapolation for producing the at least one aerial image. These three photon statistics examination modes will now be individually explained.

In a further aspect of the invention, for the purpose of production, the at least one aerial image is recorded with a metrology photon number which is substantially identical to the scanner photon number. This shall mean, that the metrology photon number is larger than the scanner photon number by at most a factor 2, in particular at most a factor 1.5, in particular at most a factor 1.3, in particular at most a factor 1.2, in particular at most a factor 1.1. This photon statistics examination mode has the advantage that the at least one aerial image is recorded under conditions which are as identical as possible to those with which the later image on the wafer is produced with the lithography apparatus. In this case, a separation of the individual contributions to the aerial image, that is to say, e.g. the photon statistics, statistical effects during mask writing, defects on the mask, systematic errors during writing of the mask or others, is not possible. When calculating the scanner photon number, it should be taken into account that a lithography lens in the EUV range has a plurality of optically effective mirrors arranged between the mask and the wafer. Proceeding for example from what are known as "normal incidence"— or NI— mirrors, only about 65%-70% of all photons are reflected at each surface. For this reason, it is necessary to take into account the photon number in the wafer plane during the determination of the scanner photon number and the photon number in the plane of the recording apparatus during the determination of the metrology photon number. Since the lenses of the microlithography apparatus and of the mask metrology apparatus differ, it is not sufficient to set the source output of the metrology light source to be substantially identical to the scanner light source. During the determination of the metrology photon number and of the scanner photon number, knowledge relating to the optical system must be included. This photon statistics examination mode can be used with particular advantage in order to verify a corrected structured region. If in the structured region of the mask a defect has been identified and subsequently corrected, it is possible to verify that the correction was a success and no effects on the critical dimension (CD), the global and local variations thereof (CDU and LCDU), the contrast, the line edge roughness (LER) or the line width roughness (LWR) remain. This should be performed advantageously under the same conditions as will be present later in the lithography apparatus.

In a further aspect of the invention, further steps are performed to produce the at least one aerial image. At least one support aerial image of the at least one structured region is recorded at a metrology photon number that deviates from the scanner photon number. Next, the aerial image is calculated from the at least one support aerial image, a model of the photon statistics in the extreme ultraviolet (EUV) wavelength range, the scanner photon number and the metrology photon number. Exactly one support aerial image is advantageously recorded with a metrology photon number which is such that the influence of the photon statistics is negligibly small. The metrology photon number can be larger than the calculated scanner photon number by at least a factor 3, in particular at least a factor 5, in particular at least a factor 10, in particular at least a factor 20, in particular at least a factor 30. The metrology photon number can also be determined in a manner such that only the influence of the photon statistics on an evaluation variable such as, e.g. CD, CDU, LCDU, contrast, LER, LWR or others is negligibly small. This photon statistics examination mode can be particularly advantageously used to separate different effects that contribute to the at least one aerial image. Direct measurement provides an aerial image which does not include the effects of the photon statistics. The aerial image which contains the overall effect of all contributions is then produced from a combination of the recorded support aerial image with a known model of the photon statistics. The knowledge of the metrology photon number and of the scanner photon number is here a necessary prerequisite.

In a further aspect of the invention, at least two support aerial images are recorded at two metrology photon numbers that differ from one another to produce the at least one aerial image. Herefrom, the at least one aerial image is then produced by interpolation or extrapolation from the at least two support aerial images. This photon statistics examination mode has the advantage that a plurality of possible aerial images for different scanner photon numbers can be examined without the need to record each image again. However, the recordings of the support aerial images can preferably be selected such that the distance of the metrology photon numbers with which the support aerial images are recorded differ not too much from the scanner photon numbers to be examined. Hereby, it is possible to adapt the relationship between the outlay of the measurement of the support aerial images and the accuracy of the results for different scanner photon numbers. In the case of an interpolation, the scanner photon number must be between the maximum and the minimum metrology photon numbers with which the support aerial images are recorded. In the case of an extrapolation, the scanner photon number is outside the range that is determined by the maximum and the minimum metrology photon numbers with which the support aerial images are recorded. Many methods for interpolation and extrapolation are known. For example, the methods can be linear interpolation or extrapolation, spline-based methods, methods using Fourier transforms or methods that use a model of the photon number dependence. What is known is that many further interpolation and extrapolation methods can be gathered from mathematical literature.

In a further aspect of the invention, at least one structure parameter of the structured region is ascertained from the at least one aerial image in an additional step. In many cases it is not aerial images or exposed wafers that are used as two-dimensional representations for evaluation purposes, but special structure parameters are selected. These relate to the specific structure or the structures present in the structured region of the photolithographic mask. These can be, e.g. dense lines ("lines and spaces"), isolated lines, contact holes, known as "assist features", which have an effect on the imaging of the intended structures but themselves do not appear in the image on the wafer, or a multiplicity of other structures. The evaluation of special structure parameters is dependent on the actually present structure. Structure parameters that can be used are, e.g. the critical dimension (CD), the line edge roughness (LER), the line width roughness (LWR), the uniformity of the critical dimension (CDU), the local uniformity of the critical dimension (LCDU) or the contrast. The exact definition of these structure parameters can likewise depend on the exact structure. For example, the critical dimension of a line structure can be defined as the distance perpendicular to the line extent between two points of the same line height at a prescribed threshold value. By contrast, the critical dimension of a contact hole can be defined as being proportional to the circumference or the area of the hole at a specific threshold value. The advantage of the ascertainment of structure parameters of the at least one aerial image are both the reduction of the data quantity to be investigated and also the fact that the evaluation is concentrated to dimensions that are relevant for a semiconductor structure.

In a further aspect of the invention, a model of the photoresist is used to ascertain the at least one structure parameter. A principle difference between the aerial images which are recorded in mask metrology apparatuses and the actual exposures of the photoresist on the wafer in lithography apparatuses relates to the processes that take place in the photoresist and contribute to the formation of structures on the wafer. These chemical processes themselves also have statistical components. For this reason, models of the chemical behaviour of the photoresist are created and the aerial images recorded with the mask metrology apparatus or the structure parameters which are determined therefrom are modified. Such models of the photoresist are known from the prior art. These models are dependent on the specially used lacquer. For this reason, a dedicated model must be created for each photoresist. Simplified models of the photoresist are also known. The simplest model is the use of a threshold value to determine the structures. If at one location the energy exceeds said threshold value, the corresponding location is exposed. If, on the other hand, the energy falls short of this threshold value, the corresponding location is not exposed. The inverse relationship is also possible, depending on whether a positive or negative photoresist is used.

In a further aspect of the invention, the structured region of the photolithographic mask contains an intended structure and at least one defect. One possible application of such mask metrology apparatuses is to examine whether defects or possible defects that have been identified on a photolithographic mask in a preceding examination step in fact manifest as a change of the structure on the wafer during the imaging on the lithography apparatus. In other words, the question is whether these defects or possible defects print or do not print. A further procedure with the mask can be derived herefrom. For example, it is possible to repair it in a repair process. This has the advantage that the rejection rate for expensive photolithographic masks can be lowered. In the case of such a repair, the location of the structured region can be stored. After the repair, said region can be measured once again with the mask metrology apparatus. In such a verification step it is examined whether the repair was successful.

In a further aspect of the invention, a representation of the process variation bands is output by the mask metrology apparatus. The exact appearance of the imaged structure of the photolithographic mask on the wafer depends on various parameters of the photolithographic process. These parameters can be, e.g. the wavelength, the illumination setting, the polarization, the exposure time or other variables. In particular in the illumination settings, a great variety is known, e.g. dipole illumination, quadrupole illumination, annular illumination, free-form illumination and many more. In order to represent the influence of said process parameters on the imaging in a meaningful context, diagrams of what are known as process variation bands ("PV bands") are used.

In a further aspect of the invention, the contributions to the at least one structure parameter are individually separated. In this way, the contributions of the photolithographic mask, of the photon statistics and/or of the photoresist can be indicated separately.

In a further aspect of the invention, a mask metrology apparatus is provided which is designed to perform a method for examining a photolithographic mask for the extreme ultraviolet (EUV) wavelength range, wherein the method steps include the following: (a) selecting at least one structured region of the mask, (b) determining a scanner photon number in the extreme ultraviolet (EUV) wavelength range for which the mask is provided in the lithographic production run, (c) determining the metrology photon number in the extreme ultraviolet (EUV) wavelength range with which the measurement is performed, (d) establishing a photon statistics examination mode on the basis of the scanner photon number from step (b) and the metrology photon number from step (c), and (e) producing at least one aerial image of the at least one structured region with the mask metrology apparatus.

Implementations of the method and apparatus can include one or more of the following features. For the purposes of production, the at least one aerial image can be recorded with a metrology photon number which is substantially identical to the scanner photon number. For the purposes of producing the at least one aerial image, the following steps can be performed: recording at least one support aerial image of the at least one structured region at a metrology photon number that deviates from the scanner photon number, calculating the aerial image from the at least one support aerial image, a model of the photon statistics in the extreme ultraviolet (EUV) wavelength range, the scanner photon number and the metrology photon number. The at least one support aerial image can be recorded at a metrology photon number which is so much greater than the scanner photon number that a contribution to the at least one support aerial image by the photon statistics is negligible. For the purposes of producing the at least one aerial image, the following steps can be performed: recording at least two support aerial images at two metrology photon numbers which differ from one another, interpolating or extrapolating the aerial image from the at least two support aerial images. The method can include the additional step of ascertaining at least one structure parameter of the structured region from the aerial image. The at least one structure parameter can be selected from a critical dimension (CD), line edge roughness (LER), line width roughness (LWR), uniformity of the critical dimension (CDU), the local uniformity of the critical dimension (LCDU) or the contrast. A model of the photoresist can be applied to ascertain the at least one structure parameter. The structured region can contain an intended structure and at least one defect. A representation of the process variation bands can be output. Contributions of the at least one structure parameter of the photolithographic mask, the photon statistics and/or the photoresist can be indicated separately.

DESCRIPTION OF DRAWINGS

Exemplary embodiments of the invention are explained in more detail below with reference to the figures. In the figures.

DETAILED DESCRIPTION

Figure 1:
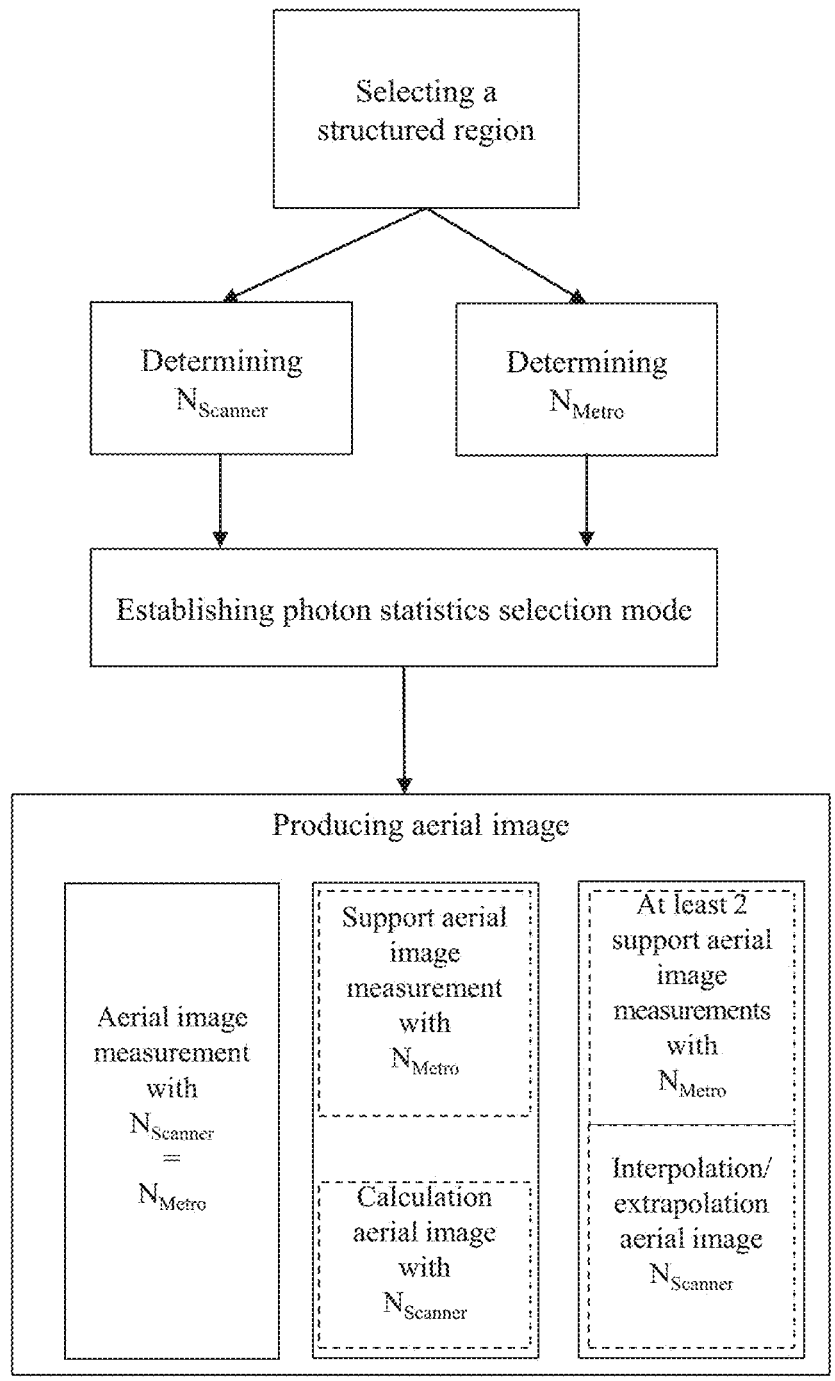
FIG. 1 shows a flowchart of the method according to the invention.
Figure 2:
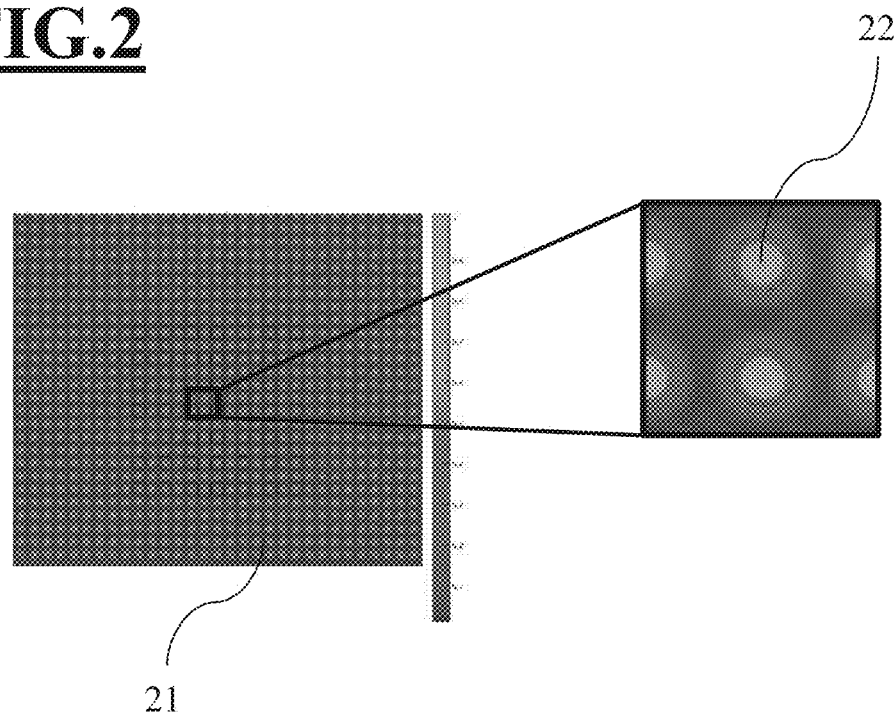
FIG. 2 shows an image of a grid of contact holes and a detail enlargement from the total image.

FIG. 1 shows a schematic illustration of a flowchart of the present invention. As an example of an arbitrary photolithographic mask, a mask having contact holes is considered here. The image that such a mask produces is illustrated in FIG. 2. A smaller region 22 is selected from the larger region 21 having an extent of 2 μm×2 μm and illustrated in enlarged form. In nominal terms, this is a dense arrangement of contact holes with a CD of 22 nm in the wafer plane. Since typical lithography apparatuses reduce the structures on the photolithographic mask four times, the structures in the mask plane are four times the size. To perform the method, first a structured region of the photolithographic mask is selected. In this case, the region contains the arrangement of contact holes shown. In order to correctly take into account the influence of the photon statistics of the EUV light, first the required photon numbers are determined. Determined is the photon number $N_{Scanner}$, for which the mask is provided in the production run on the lithography apparatus. Also determined is the photon number $N_{Metro}$, with which the recording of the at least one aerial image will be performed on the mask metrology apparatus. Since these two photon numbers are independent of one another, they can also be determined independently of one another. The sequence of the two determinations is not important either. Subsequently, the photon statistics examination mode is established. Overall, a plurality of measurements were performed with different photon statistics examination modes.

First considered is a scanner photon number $N_{Scanner}$ which is substantially identical to the metrology photon number. Accordingly, a photon statistics examination mode is used, in which the at least one aerial image is recorded directly under the same conditions as in the lithography apparatus. The recorded aerial images are not shown here. The recorded aerial image thus contains all the effects that can also be seen in the lithography apparatus on the wafer. That is to say, contributions of the mask manufacture, the actual imaging of the lithography lens, the illumination settings and the photon statistics are contained.

The recorded aerial image is here not shown directly. A structure parameter in the structured region from the aerial image is evaluated. Many different structure parameters can be used, e.g. the critical dimension (CD), the line edge roughness (LER), the line width roughness (LWR), the uniformity of the critical dimension (CDU), the local uniformity of the critical dimension (LCDU), the contrast and many more.

Known mask metrology apparatuses offer a variety of possible evaluations. In this case, the critical dimension (CD) of the contact holes is examined. The critical dimension observed here is the area of the contact hole. It is desirable to separate the different effects from one another and to represent the effect of the photon statistics on the CD. The systematic effects, i.e. the quality of the mask production, are described by the average value of each structure (average via repetitions). By subtracting this average from the measurement values, the statistical effects can be isolated. For example, it is possible on the basis of these CD values without average values to calculate the local CDU effect of the photon statistics (e.g. as three times the standard deviation over the contact holes). In order to determine the area of the contact holes, a model of the photoresist must be applied. Here, a simple threshold value is used to determine the inner and outer regions of the contact holes. Conventional image processing algorithms are then used to determine the enclosed area and consequently the CD.

Figure 4:
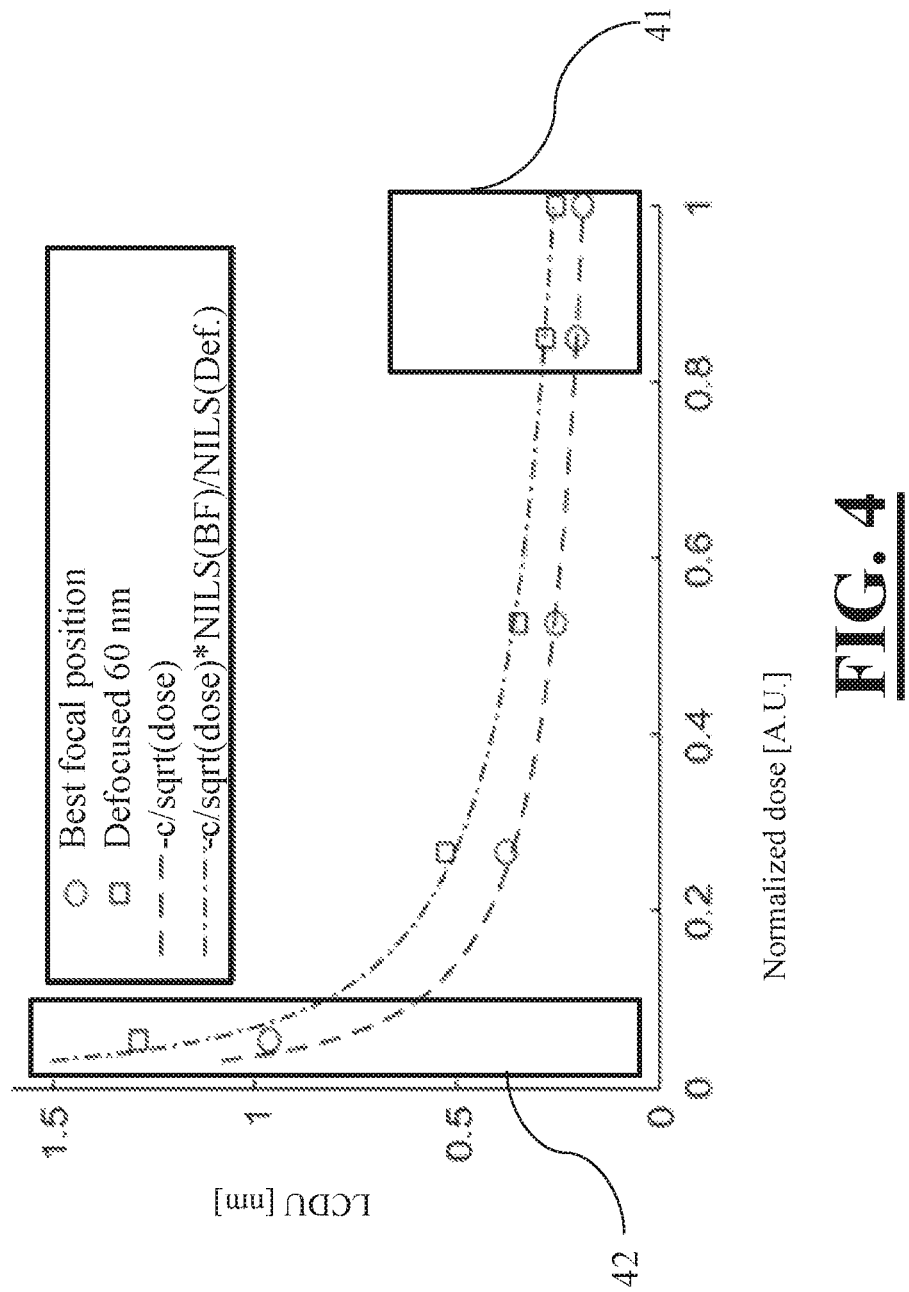
FIG. 4 shows a relationship between the normalized dose and the local CDU (LCDU).

FIG. 4 shows the local variation of the CD (LCDU) obtained on the y-axis. The normalized dose is plotted on the x-axis of FIG. 4. By way of the stated relationship E=N*h*c/λ, the dose can also be converted at any time to a photon number. Since the dose is here given in arbitrary units, there is no substantial difference between a photon number and a dose. The photon statistics examination mode applied in this exemplary embodiment corresponds to the region 42 in FIG. 4. It can be seen that the influence of the photon statistics at the selected scanner photon numbers constitutes a contribution of approximately 1 nm CD in the best focal position (circles in FIG. 4). Measurements were also made 60 nm outside the best focal position. In the case of this defocusing, the contribution of the photon statistics is already significantly higher between approximately 1.3 nm and 1.5 nm CD. A model of the influence of the photon statistics is known. Assuming a Poisson distribution of the photons, the result is that the LCDU is proportional to a factor $1/\sqrt{dose}$. FIG. 4 shows that this model is confirmed by the measurements.

A further recording of a support aerial image is taken at a metrology photon number which is so much greater than the scanner photon number that a contribution to the at least one support aerial image by the photon statistics is negligible. In FIG. 4, such a metrology photon number corresponds to a dose of 0.8-1 in the selected arbitrary units. This region 41 is depicted in FIG. 4. An evaluation of the at least one support aerial image can also be used to separate the effects. In this support aerial image, only the systematic effects of the mask production and the lithography apparatus are contained. The concrete dose or metrology photon number that must be selected for the effects of the photon statistics to be negligible depends on the concrete structure dimension under consideration. In the present case of 22 nm contact holes, a reduction of the effect to approximately 0.2-0.1 nm CD is sufficient. Consequently, a limit value is prescribed and the metrology photon number is selected to be so high that the prescribed limit value is not reached in a structure parameter. It is clear that due to the weak square-root dependence on the metrology photon number the measurement times correspondingly increase if even better decoupling is to be achieved. Here, the measurement duration must be weighed against the measurement accuracy.

A second photon statistics examination mode comes about based on the support aerial image, as has just been described and is illustrated in FIG. 4 as the region 41. To this end, for the at least one support aerial image and the described model of the photon statistics in the extreme ultraviolet (EUV) wavelength range, the scanner photon number and the metrology photon number, the at least one aerial image is calculated. The advantage of this process is that both an aerial image without the influence of the photon statistics, specifically the at least one support aerial image, and an aerial image that contains the effects of the photon statistics are obtained. Another advantage is that simulations of different scanner photon numbers can be quickly produced from only one measurement of the support aerial image. The disadvantage is that a good knowledge of the model is needed for this procedure. This photon statistics examination mode is therefore particularly suitable for examinations of parameter ranges.

A further photon statistics examination mode is based on the recording of at least two support aerial images, with two metrology photon numbers that differ from one another and subsequent interpolation or extrapolation of the aerial image from the at least two support aerial images. This case is not shown in FIG. 4, but can be explained on the basis of FIG. 4. However, here a total of five measurements for different metrology photon numbers are given. These are shown for the best focal position as circles, and as squares for a 60 nm defocus. An evaluation at a scanner photon number that would correspond to a dose of 0.4 can then be applied to two support aerial images which were recorded at metrology photon numbers that correspond to the dose values of approximately 0.25 and 0.5. The at least one aerial image can then be produced as an interpolation between the two support aerial images. With the knowledge of a model of the photoresist, structure parameters can then be evaluated. It is also clear from this example that both a simple linear interpolation and an interpolation along the model of the photon statistics make sense.

Figure 3:
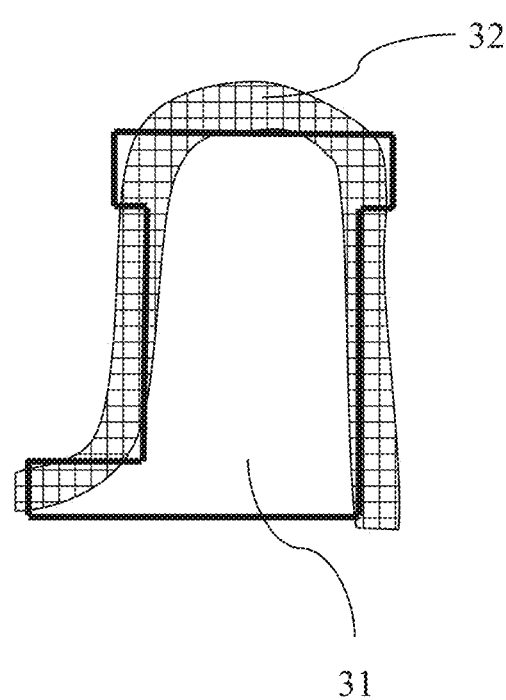
FIG. 3 shows a diagram of a process variation band.

Mask metrology apparatuses offer the user a large variety of evaluation algorithms. A mask metrology apparatus that is designed to automatically perform the described photon statistics evaluation modes will offer further representations by way of the evaluation of said structure parameters with which the mask structures in the structured region of the photolithographic mask can be described. What are known as process variation bands ("PV bands") have proven particularly useful here. The exact appearance of the imaged structure of the photolithographic mask on the wafer depends on various parameters of the photolithographic process. These parameters can be, e.g. the wavelength, the illumination setting, the polarization, the exposure time or other variables. In particular in the illumination settings, a great variety is known, e.g. dipole illumination, quadrupole illumination, annular illumination, free-form illumination and many more. With each selection of the parameters of the lithography system, aerial images are obtained which slightly differ from one another. Shown in the PV band diagrams are the envelopes of all line structures with a variation of the process parameters. FIG. 3 shows a simple example. The region 31 here gives the intended structure on the mask. All variations of the process parameters in an application of a photoresist model result in contour lines in the aerial image which are all located within the hatched region 32. The maximum influence of the process parameters on the at least one aerial image can hereby be visualized and estimated well.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for examining a photolithographic mask for the extreme ultraviolet (EUV) wavelength range in a mask metrology apparatus, wherein the method includes the following steps:
    a. selecting at least one structured region of the mask,
    b. determining a scanner photon number in the extreme ultraviolet (EUV) wavelength range for which the mask is provided in a lithographic production run, in which the scanner photon number is defined by $E1=N1*h*c/\lambda 1$, E1 represents a quantity of energy used in the lithographic production run, N1 represents the scanner photon number, $\lambda 1$ represents the wavelength used in the lithographic production run, c represents the speed of light in a vacuum, and h represents Planck's constant,
    c. determining the metrology photon number in the extreme ultraviolet (EUV) wavelength range with which a measurement is performed, in which the metrology photon number is defined by $E2=N2*h*c/\lambda 2$, E2 represents a quantity of energy used in the measurement, N2 represents the metrology photon number, and $\lambda 2$ represents the wavelength used in the measurement,
    d. establishing a photon statistics examination mode on the basis of the scanner photon number from step b) and the metrology photon number from step c), and
    e. producing at least one aerial image of the at least one structured region with the mask metrology apparatus.

2. The method according to claim 1, wherein for producing the at least one aerial image it is recorded with a metrology photon number which is substantially identical to the scanner photon number.

3. The method according to claim 1, wherein, for the purposes of producing the at least one aerial image, the following steps are performed:
    recording at least one support aerial image of the at least one structured region at a metrology photon number that deviates from the scanner photon number, and
    calculating the aerial image from the at least one support aerial image, a model of the photon statistics in the extreme ultraviolet (EUV) wavelength range, the scanner photon number and the metrology photon number.

4. The method according to claim 3, wherein the at least one support aerial image is recorded at a metrology photon number which is so much greater than the scanner photon number that a contribution to the at least one support aerial image by the photon statistics is negligible.

5. The method according to claim 1, wherein, for the purposes of producing the at least one aerial image, the following steps are performed:
    recording at least two support aerial images at two metrology photon numbers which differ from one another, and
    interpolating or extrapolating the aerial image from the at least two support aerial images.

6. The method according to claim 1, including the additional step of:
    ascertaining at least one structure parameter of the structured region from the aerial image.

7. The method according to claim 6, wherein the at least one structure parameter is selected from a critical dimension (CD), line edge roughness (LER), line width roughness (LWR), uniformity of the critical dimension (CDU), the local uniformity of the critical dimension (LCDU) or the contrast.

8. The method according to claim 6, wherein a model of the photoresist is applied to ascertain the at least one structure parameter.

9. The method according to claim 1, wherein the structured region contains an intended structure and at least one defect.

10. The method according to claim 1, wherein a representation of the process variation bands is output.

11. The method according to claim 8, wherein contributions of the at least one structure parameter of the photolithographic mask, the photon statistics and/or the photoresist are indicated separately.

12. A mask metrology apparatus, wherein the mask metrology apparatus is designed to perform a method for examining a photolithographic mask for the extreme ultraviolet (EUV) wavelength range in the mask metrology apparatus, the method steps including
  a. selecting at least one structured region of the mask,
  b. determining a scanner photon number in the extreme ultraviolet (EUV) wavelength range for which the mask is provided in a lithographic production run, in which the scanner photon number is defined by $E1=N1*h*c/\lambda 1$, E1 represents a quantity of energy used in the lithographic production run, N1 represents the scanner photon number, $\lambda 1$ represents the wavelength used in the lithographic production run, c represents the speed of light in a vacuum, and h represents Planck's constant,
  c. determining the metrology photon number in the extreme ultraviolet (EUV) wavelength range with which a measurement is performed, in which the metrology photon number is defined by $E2=N2*h*c/\lambda 2$, E2 represents a quantity of energy used in the measurement, N2 represents the metrology photon number, and $\lambda 2$ represents the wavelength used in the measurement,
  d. establishing a photon statistics examination mode on the basis of the scanner photon number from step b) and the metrology photon number from step c), and
  e. producing at least one aerial image of the at least one structured region with the mask metrology apparatus.

13. The mask metrology apparatus of claim 12, wherein for the purposes of production, the at least one aerial image is recorded with a metrology photon number which is substantially identical to the scanner photon number.

14. The mask metrology apparatus of claim 12, wherein, for the purposes of producing the at least one aerial image, the following steps are performed:
  recording at least one support aerial image of the at least one structured region at a metrology photon number that deviates from the scanner photon number, and
  calculating the aerial image from the at least one support aerial image, a model of the photon statistics in the extreme ultraviolet (EUV) wavelength range, the scanner photon number and the metrology photon number.

15. The mask metrology apparatus of claim 14, wherein the at least one support aerial image is recorded at a metrology photon number which is so much greater than the scanner photon number that a contribution to the at least one support aerial image by the photon statistics is negligible.

16. The mask metrology apparatus of claim 12, wherein, for the purposes of producing the at least one aerial image, the following steps are performed:
  recording at least two support aerial images at two metrology photon numbers which differ from one another, and
  interpolating or extrapolating the aerial image from the at least two support aerial images.

17. The mask metrology apparatus of claim 12, wherein the method includes the additional step of ascertaining at least one structure parameter of the structured region from the aerial image.

18. The mask metrology apparatus of claim 17, wherein the at least one structure parameter is selected from a critical dimension (CD), line edge roughness (LER), line width roughness (LWR), uniformity of the critical dimension (CDU), the local uniformity of the critical dimension (LCDU) or the contrast.

19. The mask metrology apparatus of claim 17, wherein a model of the photoresist is applied to ascertain the at least one structure parameter.

20. The mask metrology apparatus of claim 12, wherein the structured region contains an intended structure and at least one defect.

* * * * *